(12) United States Patent
Yamada

(10) Patent No.: US 6,452,829 B1
(45) Date of Patent: Sep. 17, 2002

(54) FERROELECTRIC MEMORY DEVICE

(75) Inventor: Junichi Yamada, Tokyo (JP)

(73) Assignee: NEC Corporation, Tokyo (JP)

( * ) Notice: Subject to any disclaimer, the term of this patent is extended or adjusted under 35 U.S.C. 154(b) by 117 days.

(21) Appl. No.: 09/663,725

(22) Filed: Sep. 15, 2000

(30) Foreign Application Priority Data

Sep. 21, 1999 (JP) .......................................... 11-267404

(51) Int. Cl.[7] .............................................. G11C 11/22
(52) U.S. Cl. ...................................... 365/145; 365/149
(58) Field of Search ................................. 365/145, 149

(56) References Cited

U.S. PATENT DOCUMENTS 5,532,953 A  *  7/1996  Ruesch et al. ............... 365/145
5,889,696 A     3/1999  Kawakubo et al.
5,910,911 A     6/1999  Sekiguchi et al.

FOREIGN PATENT DOCUMENTS

WO  0798736 A2  10/1997

* cited by examiner

Primary Examiner—Richard Elms
Assistant Examiner—VanThu Nguyen
(74) Attorney, Agent, or Firm—Scully, Scott, Murphy & Presser

(57) ABSTRACT

A ferroelectric memory device has a ferroelectric capacitor comprising a ferroelectric thin film and a first capacitive electrode and a second capacitive electrode which sandwich the ferroelectric thin film therebetween. The ferroelectric memory device is operable in a wide range of allowable power supply voltages such that it can operate at a low power supply voltage. The ferroelectric thin film is formed such that a coercive voltage thereof is smaller than a reduced voltage applied between the first capacitive electrode and the second capacitive electrode and generated by reducing an external power supply voltage supplied in a predetermined voltage range.

11 Claims, 7 Drawing Sheets

FERROELECTRIC MEMORY DEVICE

BACKGROUND OF THE INVENTION

1. Field of the Invention

The present invention relates to a nonvolatile semiconductor memory device, and more particularly to a ferroelectric memory device using a ferroelectric material.

2. Description of the Prior Art

It is known in the art that a ferroelectric capacitor comprising a ferroelectric thin film sandwiched by a pair of capacitive electrodes exhibits hysteresis between the voltage applied thereto and the polarization that represents the displacement of a positive or negative electric charge caused by the applied voltage. After a certain voltage is applied to the ferroelectric capacitor to make it polarized, it remains polarized due to the hysteresis even when the applied voltage is eliminated. This property of the ferroelectric capacitor may be used to turn it into a nonvolatile memory device. A nonvolatile memory device that comprises a ferroelectric capacitor as a memory element is referred to as a ferroelectric memory device.

Ferroelectric memory devices have different memory cell types. One memory cell type is a two-transistor, two-capacitor type comprising two cell transistors and two ferroelectric capacitors. Another memory cell type is a one-transistor, one-capacitor type comprising a single cell transistor and a single ferroelectric capacitor. The two-transistor, two-capacitor type memory cells are advantageous in that they are less susceptible to variations in the fabrication process. The one-transistor, one-capacitor type memory cells are advantageous in that they lend themselves to being constructed as a highly integrated circuit.

The memory cells of these different types operate on the same basic principle that a voltage is applied to the ferroelectric capacitor to read and write data. For writing data, it is necessary to apply a voltage higher than the voltage at which the residual polarization of the ferroelectric capacitor starts being reversed, i.e., the coercive voltage at a point where the hysteresis curve crosses a linear curve of no polarization, for causing the reversed polarization to remain.

The ferroelectric capacitor is known as causing deterioration referred to as fatigue and imprinting if the polarization is repeatedly reversed. The ferroelectric capacitor suffers more fatigue and imprinting as the applied voltage is higher. If the deterioration progresses, then signal voltages applied to sense amplifiers in the ferroelectric memory device are lowered to the extent that data cannot be read and written properly. Specifically, as the applied voltage is higher, the number of times that the ferroelectric capacitor can repeatedly be operated is reduced, and the number of times that the ferroelectric memory device can write data is also reduced.

For the above reasons, it is important to apply such a voltage as to sufficiently reverse the polarization of ferroelectric capacitors and minimize the deterioration thereof in the ferroelectric memory device.

One scheme to produce such a voltage is an arrangement for controlling the applied voltage. Specifically, an external power supply voltage is lowered by a step-down circuit (voltage reducing circuit) to generate an applied voltage that is used to drive plate lines. Since word lines need to drive transistors, a voltage higher than the applied voltage used to drive the plate lines is used to drive the word lines. With such a voltage controlling arrangement, it is possible to produce a ferroelectric memory device which can sufficiently read and writ data, suffers reduced deterioration of ferroelectric capacitors, and can repeatedly be operated for an increased number of times.

Since ferroelectric memory devices are of such a structure that it can operate at a lower voltage than EEPROMs (electrically erasable and programmable read-only memories) and flash memories that are generally used as nonvolatile memories, they are expected to be used as nonvolatile memory devices for IC (integrated circuit) cards. IC cards are required to be operable in a very wide power supply voltage range. For example, contact IC cards are required to be operable at both power supply voltages of 5 V and 3 V, and contactless IC cards are required to be operable at a lower voltage.

However, the conventional ferroelectric memory devices are problematic in that if the power supply voltage is lowered, then no sufficient voltage can be applied to the ferroelectric capacitors, and as a result, no sufficient residual polarization occurs in the ferroelectric capacitors. These drawbacks are caused by the arrangement of the conventional ferroelectric memory devices which is not designed to bring about a substantial reduction in the power supply voltage.

SUMMARY OF THE INVENTION

It is therefore an object of the present invention to provide a ferroelectric memory device which is operable in a wide range of allowable power supply voltages such that it can operate at a low power supply voltage.

According to the present invention, the above object can be achieved by a ferroelectric memory device comprising a bit line, a ferroelectric capacitor for storing data based on residual polarization thereof, the ferroelectric capacitor comprising a ferroelectric thin film and a first capacitive electrode and a second capacitive electrode which sandwich the ferroelectric thin film therebetween, a cell transistor connected between the first capacitive electrode and the bit line, a first drive circuit for selectively supplying a first voltage and a ground potential to the second capacitive electrode, and a step-down circuit for reducing an external power supply voltage supplied in a predetermined voltage range into the first voltage, the ferroelectric thin film being formed such that a coercive voltage thereof is smaller than the first voltage.

Preferably, a reduced voltage generated by reducing the external power supply voltage to a minimum value of its variable range should be applied to the ferroelectric capacitor. Furthermore, the ferroelectric thin film should be formed such that a coercive voltage of the ferroelectric capacitor is equal to a minimum value of a range for allowing the ferroelectric thin film to remain sufficiently polarized.

With the above arrangement, the ferroelectric memory device is operable in a wide range of external power supply voltages, has the ferroelectric thin film that can remain sufficiently polarized to store data, and suffers reduced deterioration due to repeated operation.

The above and other objects, features, and advantages of the present invention will become apparent from the following description with reference to the accompanying drawings which illustrate examples of the present invention.

DESCRIPTION OF THE PREFERRED EMBODIMENTS

Figure 1A:
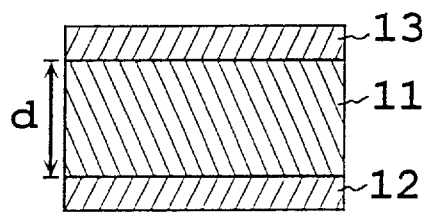
FIG. 1A is a cross-sectional view of a ferroelectric capacitor.
Figure 1:
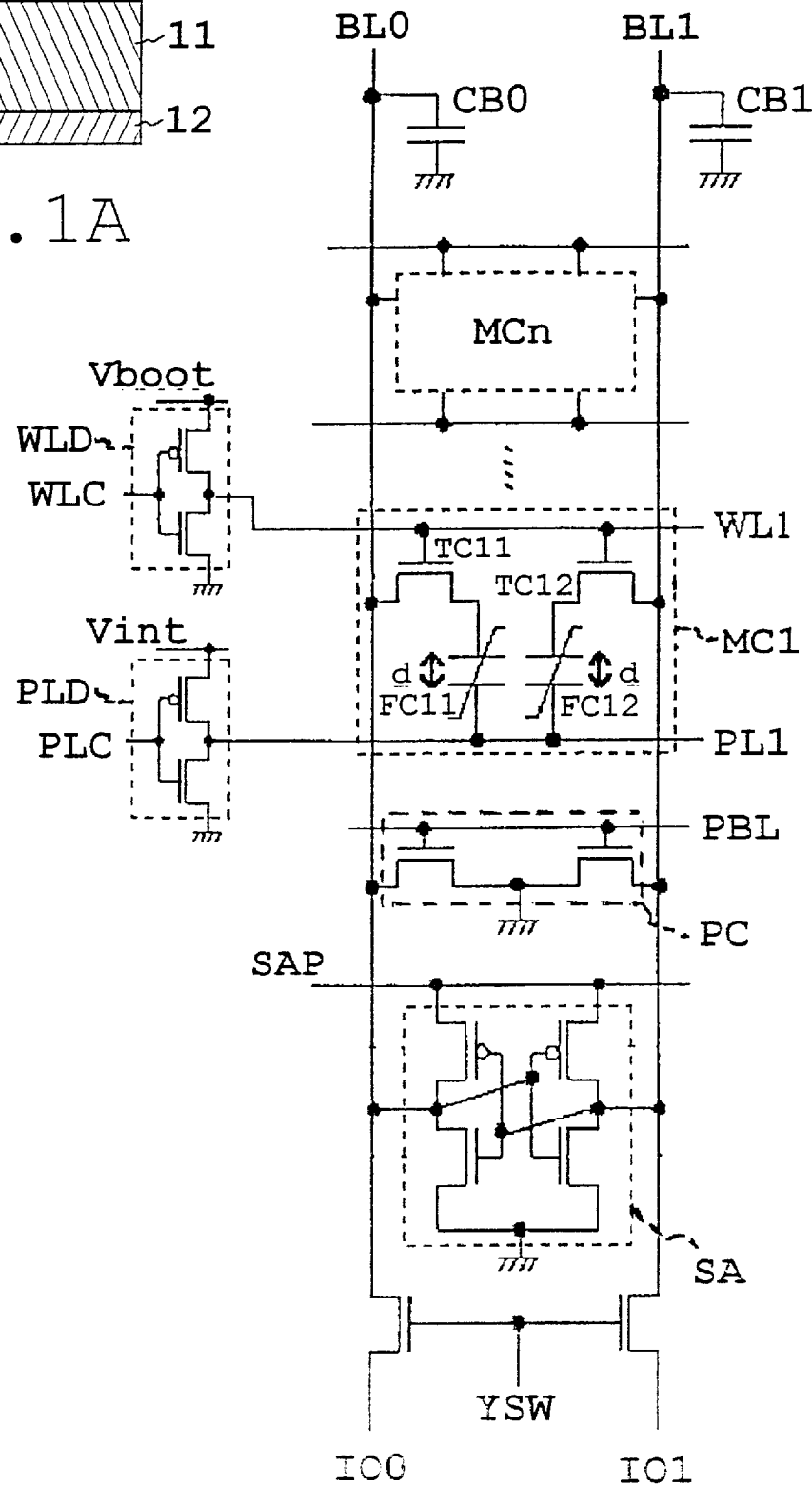
FIG. 1 is a circuit diagram of a memory cell array of a ferroelectric memory device according to a first embodiment of the present invention.

FIG. 1 shows a memory cell array of a ferroelectric memory device according to a first embodiment of the present invention. The ferroelectric memory device shown in FIG. 1 is of the two-transistor, two-capacitor type. As shown in FIG. 1, the ferroelectric memory device according to the first embodiment comprises bit lines BL0, BL1, memory cells MC1–MCn for storing data, word line drive circuit WLD for controlling the potential of word line WL1, and plate line drive circuit PLD for controlling the potential of plate line PL1. Though not shown in FIG. 1 for the sake of brevity, the above components are connected vertically and horizontally in a repeated pattern to make up memory cell array 103 (see FIG. 2) of the ferroelectric memory device. The ferroelectric memory device also has precharging circuit PC for precharging bit lines BL0, BL1 to a ground (GND) level, and sense amplifier SA for amplifying the potential difference between bit line BL0 and bit line BL1.

Bit lines BL0, BL1 are paired with each other, and input data to and output data from input/output lines IO0, IO1 according to Y selection signal YSW. Bit lines BL0, BL1 have respective parasitic capacitances that are equivalently represented by capacitances CB0, CB1, respectively.

Memory cell MC1 comprises two ferroelectric capacitors FC11, FC12 and two cell transistors TC11, TC12. As shown in FIG. 1A, each of ferroelectric capacitors FC11, FC12 comprises ferroelectric film 11 sandwiched between a pair of capacitive electrodes 12, 13. Ferroelectric film 11 has a thickness d. Capacitive electrode 12 of ferroelectric capacitor FC11 is connected to plate line PL1, and the other capacitive electrode 13 thereof is connected to the source of cell transistor TC11. Capacitive electrode 12 of ferroelectric capacitor FC12 is connected to plate line PL1, and the other capacitive electrode 13 thereof is connected to the source of cell transistor TC12. Though not specifically shown in FIG. 1, each of memory cells MC2–MCn is structurally identical to memory cell MC1.

Cell transistors TC11, TC12 have respective gates connected to word line WL1. Cell transistor TC11 has a drain connected to bit line BL0, and cell transistor TC12 has a drain connected to bit line BL1.

Word line drive circuit WLD has two series-connected transistors, and is controlled by word line voltage control signal WLC to supply a voltage at a Vboot level or GND level to word line WL1. Similarly, plate line drive circuit PLD has two series-connected transistors, and is controlled by plate line voltage control signal PLC to supply a voltage at a Vint level or GND level to plate line WL1.

Precharging circuit PC has two transistors, and is controlled by bit line precharging signal PBL to precharge bit lines BL0, BL1 to the GND level as an initial state.

Sense amplifier SA has four transistors. When activated by sense amplifier activation signal SAP, sense amplifier SA amplifies the potential difference between bit lines BL0, BL1. The amplified potential difference is outputted to input/output lines IO0, IO1 under the control of Y selection signal YSW.

Figure 2:
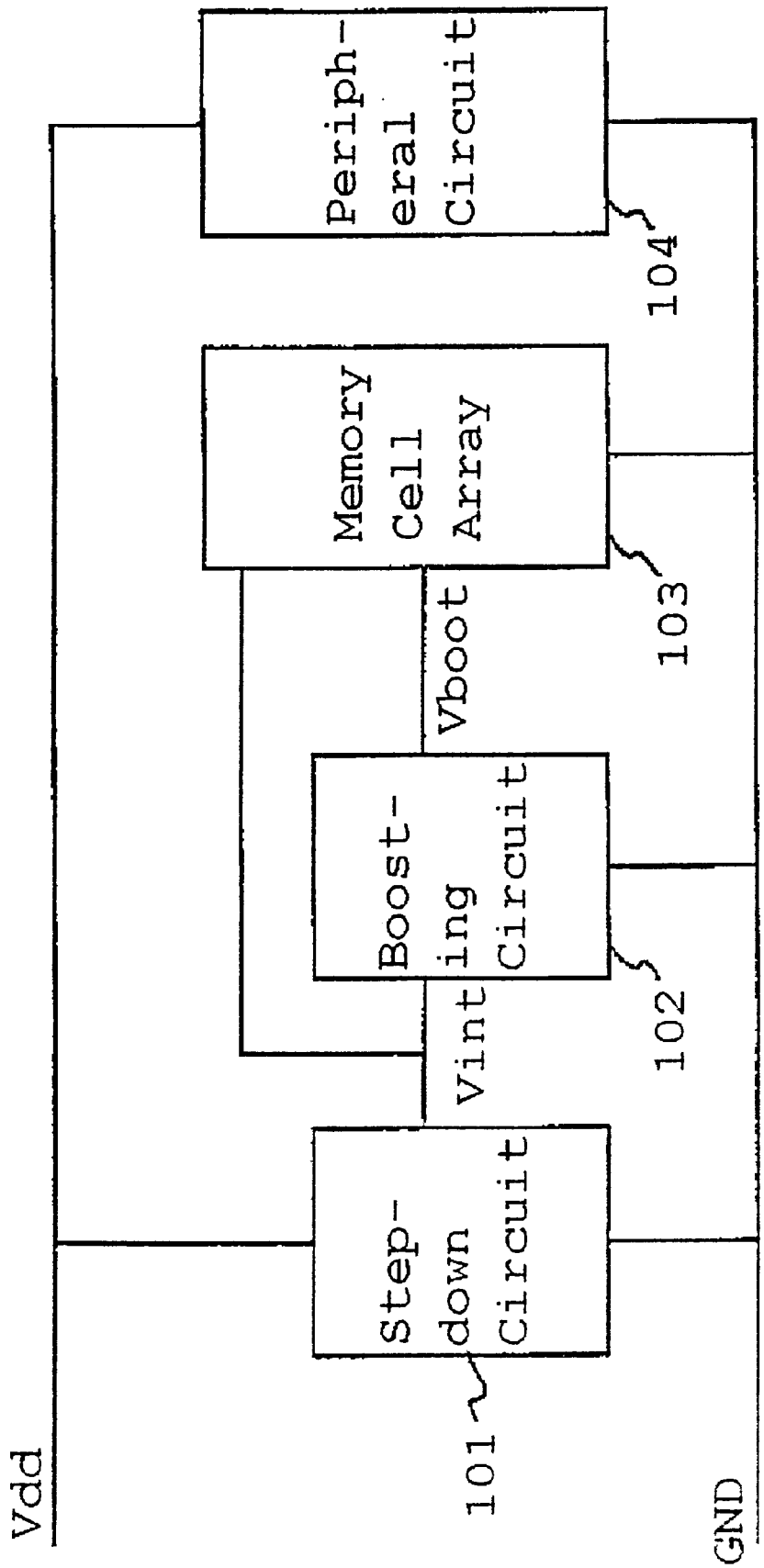
FIG. 2 is a block diagram of an arrangement for supplying a voltage in the ferroelectric memory device shown in FIG. 1.

As described above, the memory cell array is supplied with two voltage levels Vint, Vboot. FIG. 2 shows an arrangement for supplying voltages to memory cell array 103 of the ferroelectric memory device. Of the voltage levels supplied to memory cell array 103, voltage level Vint is generated by step-down circuit (voltage reducing circuit) 101, and voltage level Vboot is generated by boosting circuit (voltage increasing circuit) 102. Specifically, external power supply voltage Vdd supplied from an external power supply to the ferroelectric memory device is supplied to peripheral circuit 104 in the ferroelectric memory device, and is also supplied to step-down circuit 101, which lowers applied voltage Vdd to voltage Vint that represents a minimum value of a variable range of voltage Vdd. Boosting circuit 102 increases voltage Vint to voltage Vboot that is required to operate cell transistors TC11, TC12. Both step-down circuit 101 and boosting circuit 102 are included in the ferroelectric memory device.

Figure 3:
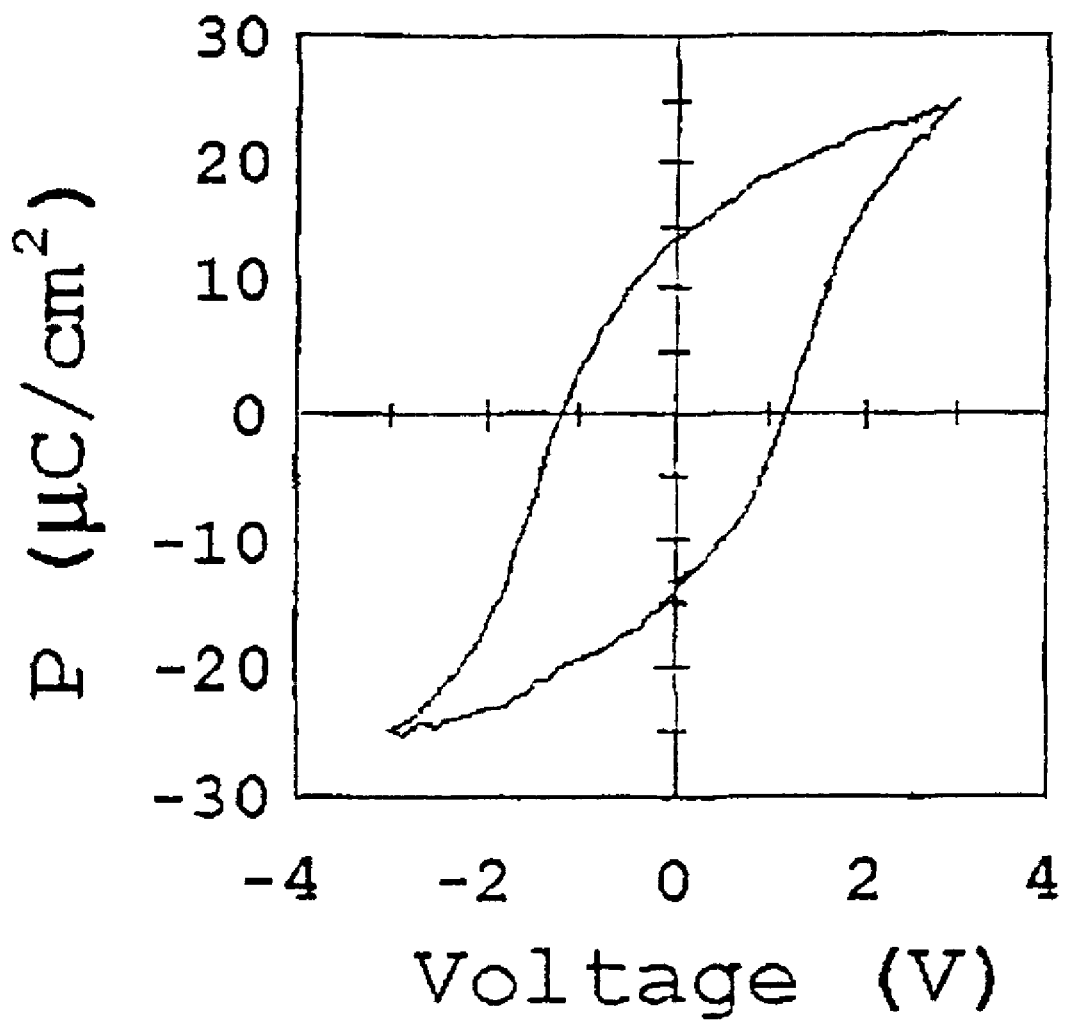
FIG. 3 is a diagram showing a polarization (P)-applied voltage (V) curve of a ferroelectric capacitor whose hysteresis is not saturated by the applied voltage.
Figure 4:
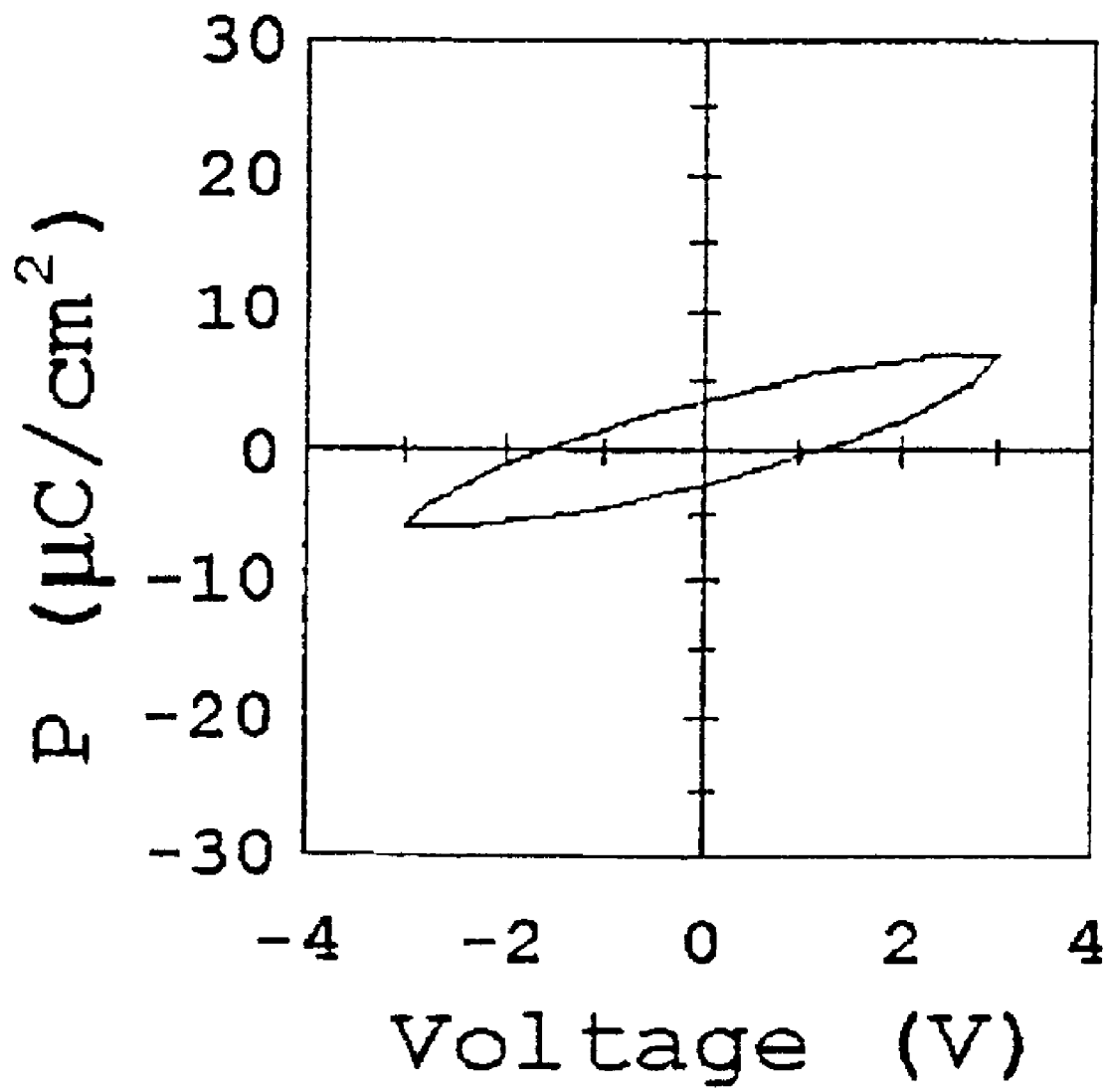
FIG. 4 is a diagram showing a polarization (P)-applied voltage (V) curve of a ferroelectric capacitor whose hysteresis is saturated by the applied voltage.

As shown in FIG. 1A, each of ferroelectric-capacitors FC11, FC12 has ferroelectric film 11 sandwiched between capacitive electrodes 12, 13. Ferroelectric film 11 is made of a ferroelectric material such as PZT (PbZrO3+PbTiO3). Ferroelectric film 11 has such a thickness d as to sufficiently saturate the P (polarization)-V (applied voltage) hysteresis curve in order to store data due to residual polarization and also to minimize deterioration due to repeated operation at applied voltage Vint. For example, if the minimum value of the variable range of external power supply voltage Vdd, i.e., applied voltage Vint, is 3 V, then the thickness of ferroelectric film 11 of each of ferroelectric capacitors FC11, FC12 is selected such that, as shown in FIG. 3, the coercive voltage is lower than the applied voltage and the P-V hysteresis curve is sufficiently saturated at the applied voltage of 3 V. If the thickness of ferroelectric film 11 were greater, then the P-V hysteresis curve would not be sufficiently saturated at the applied voltage of 3V and data would not be stored due to residual polarization, as shown in FIG. 4.

Operation of the ferroelectric memory device will be described below with reference to a timing chart shown in FIG. 5. First, a data reading cycle will be described. It is assumed that high and low potentials of varying signal voltages are referred to as H and L levels, respectively. Even if external power supply voltage Vdd varies, step-down circuit 101 and boosting circuit 102 keep voltage Vint and voltage Vboot constant, respectively, and hence the H and L levels are predetermined voltage levels at all times.

Figure 5:
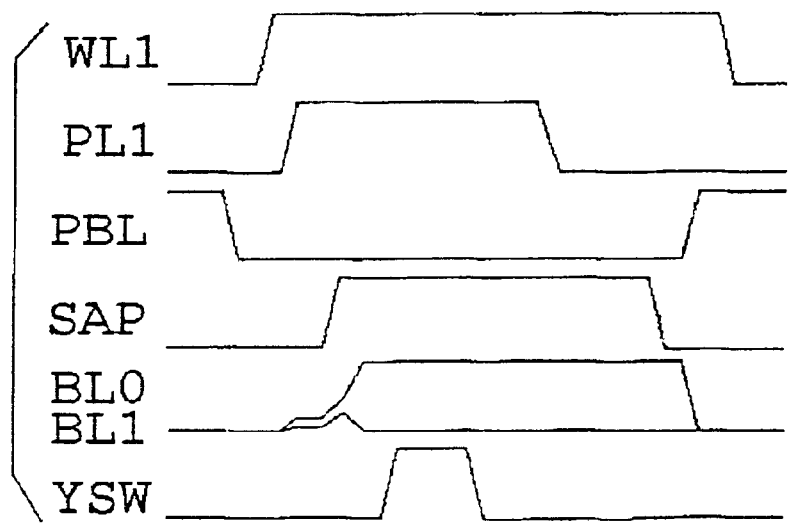
FIG. 5 is a timing chart illustrative of operation of the ferroelectric memory device shown in FIG. 1.

In FIG. 5, while bit line precharging signal PBL is of the H level, bit lines BL0, BL1 are precharged to the L level. After bit line precharging signal PBL changes to the L level, word line WL1 changes from the L level to the H level, thus selecting memory cell MC1. When plate line PL1 then changes from the L level to the H level, the states of ferroelectric capacitors FC11, FC12 are read to bit lines BL0, BL1, respectively. At this time, the potential difference between bit lines BL0, BL1 is small. Then, when sense amplifier activation signal SAP changes from the L level to the H level, sense amplifier SA is activated to amplify the potential difference between bit lines BL0, BL1. Thereafter, when Y selection signal YSW changes from the L level to the H level, the potential difference between bit lines BL0, BL1 is outputted as the potential difference between input/output lines IO0, IO1 which represents data.

Thereafter, when plate line PL1 changes to the L level, the levels of bit lines BL0, BL1 are stored respectively in ferroelectric capacitors FC11, FC12, returning to the original polarized state. Then, when bit line precharging signal PBL changes to the H level, bit lines BL0, BL1 are discharged to the L level. Finally, word line WL1 changes to the L level, canceling the selection of memory cell MC1. Now, the data reading cycle is finished.

A data writing cycle will be described below. When Y selection signal YSW changes to the H level, the states of input/output lines IO0, IO1 flow into bit lines BL0, BL1, respectively. Then, when plate line PL1 changes to the L level, the states that have flowed into bit lines BL0, BL1 are stored respectively in ferroelectric capacitors FC11, FC12. The memory cell array will subsequently operate in the same manner as with the data reading cycle.

In the first embodiment, since voltage Vint applied to ferroelectric capacitors FC11, FC12 is equal to the minimum value of the variable range of external power supply voltage Vdd, the ferroelectric memory device can operate in the wide range of external power supply voltage Vdd and hence can be used in a wide range of applications. Because the ferroelectric film of each of ferroelectric capacitors FC11, FC12 is constructed such that the coercive voltage is smaller than applied voltage Vint that is the minimum value of external power supply voltage Vdd, a sufficient residual polarization required to store data with applied voltage Vint is achieved for reading and writing data stably.

A ferroelectric memory device according to a second embodiment of the present invention will be described below with reference to FIG. 6. The ferroelectric memory device shown in FIG. 6 has memory cells each of the one-transistor, one-capacitor type.

Figure 6:
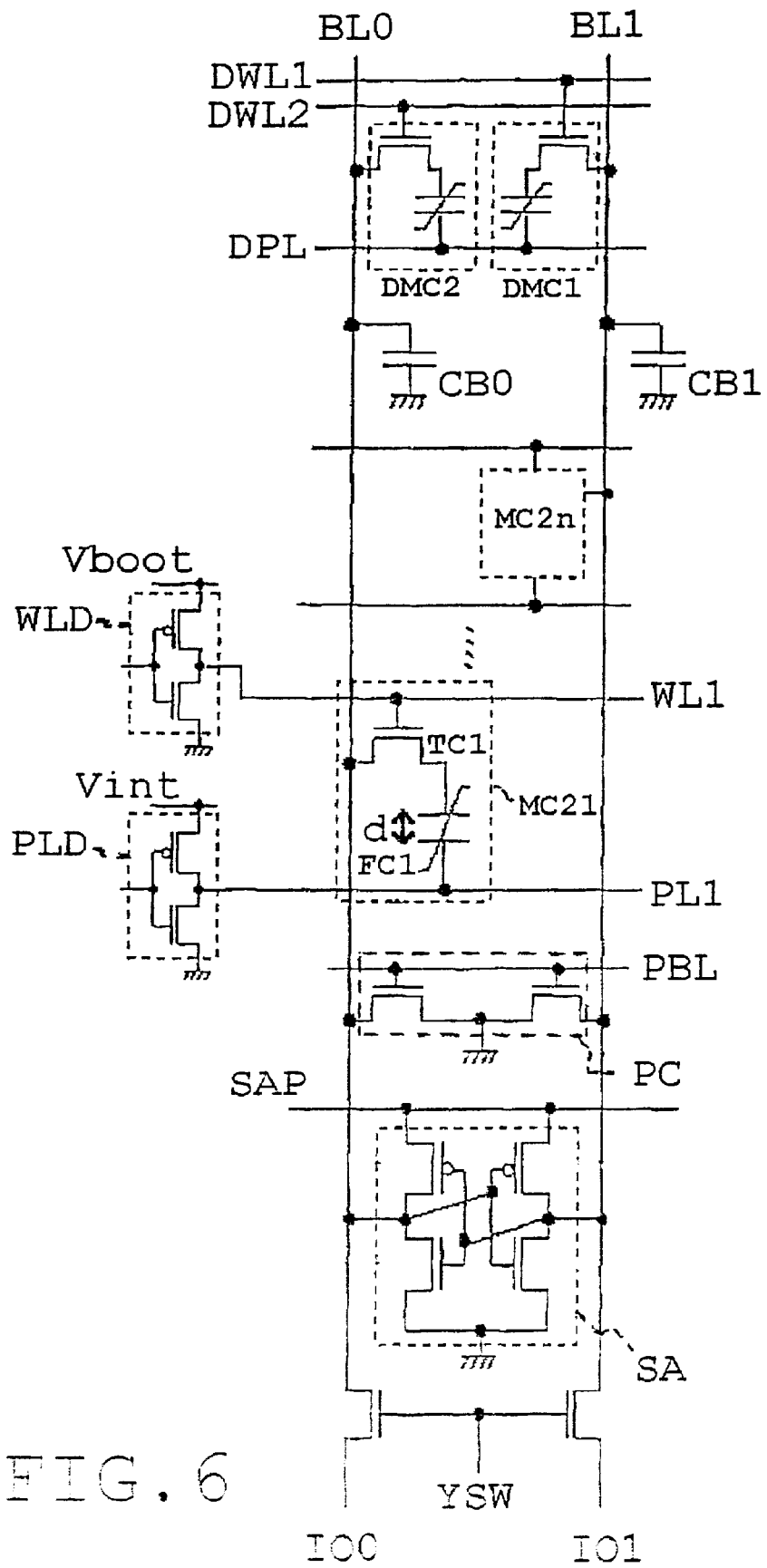
FIG. 6 is a circuit diagram of a memory cell array of a ferroelectric memory device according to a second embodiment of the present invention.
Figure 7:
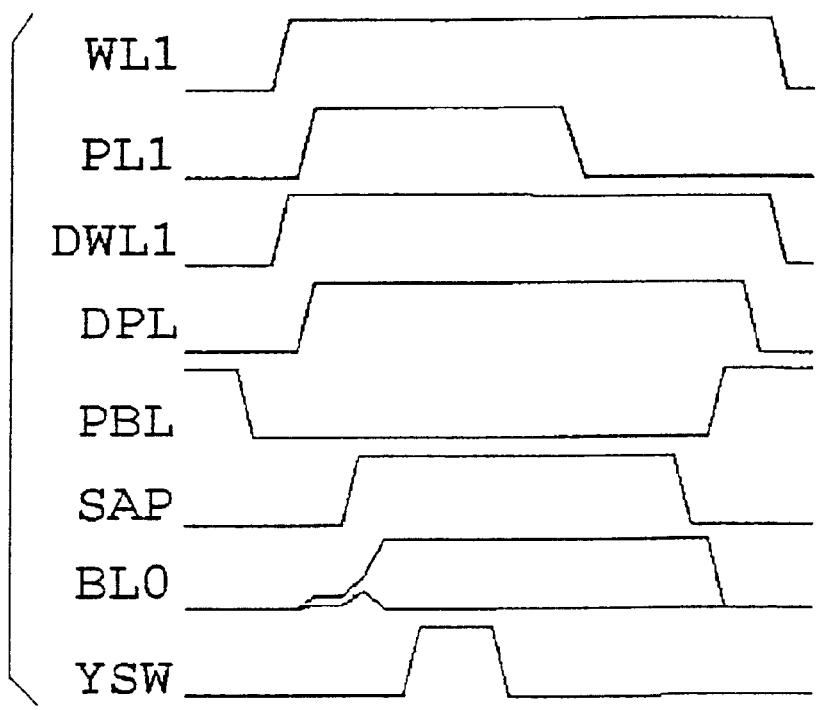
FIG. 7 is a timing chart illustrative of a data reading cycle of operation of the ferroelectric memory device shown in FIG. 6.

As shown in FIG. 6, the ferroelectric memory device according to the second embodiment has bit lines BL0, BL1, memory cells MC21–MC2n connected alternately to one of bit lines BL0, BL1, for storing data, reference voltage generating circuits DMC1, DMC2 for generating a reference voltage and supplying the reference voltage to bit lines BL0, BL1, word line drive circuit WLD for controlling the potential of word line WL1, and plate line drive circuit PLD for controlling the potential of plate line PL1. The reference voltage is a voltage for deciding whether data read from bit lines BL0, BL1 are "0" or "1", and has an intermediate value between the data of "0" and the data of "1". Though not shown in FIG. 6 for the sake of brevity, the above components are connected vertically and horizontally in a repeated pattern to make up a memory cell array of the ferroelectric memory device. The ferroelectric memory device also has precharging circuit PC for precharging bit lines BL0, BL1 to a ground (GND) level, and sense amplifier SA for amplifying the potential difference between bit lines BL0, BL1.

Bit lines BL0, BL1 are paired with each other, and input data to and output data from input/output lines IO0, IO1 according to Y selection signal YSW. Bit lines BL0, BL1 have respective parasitic capacitances that are equivalently represented by capacitances CB0, CB1, respectively.

Memory cell MC21 comprises ferroelectric capacitor FC1 and cell transistor TC1. Ferroelectric capacitor FC1 comprises a ferroelectric film sandwiched between a pair of capacitive electrodes, and is of a structure identical to the structure shown FIG. 1A. One of the electrodes of ferroelectric capacitor FC1 is connected to plate line PL1, and the other electrode thereof is connected to the source of cell transistor TC1.

Cell transistor TC1 has a gate connected to word line WL1 and a drain connected to bit line BL0.

Word line drive circuit WLD, plate line drive circuit PLD, precharging circuit PC, and sense amplifier SA are identical to those of the ferroelectric memory device according to the first embodiment. The arrangement for supplying voltages to the ferroelectric memory device according to the second embodiment is also identical to the voltage supplying arrangement according to the first embodiment.

As described above, ferroelectric capacitor FC1 has the ferroelectric film sandwiched between the two electrodes, and the ferroelectric film has such a thickness d as to sufficiently saturate the P-V hysteresis curve and also to minimize deterioration due to repeated operation at applied voltage Vint.

A data reading cycle of operation of the ferroelectric memory device shown in FIG. 6 will be described below.

When memory cell MC21 is selected by word line WL1 changing from the L level to the H level, reference voltage generating circuit DMC1 is also selected by word line DWL1 therefor that changes from the L level to the H level. Thereafter, when plate line PL1 changes from the L level to the H level, the state of the ferroelectric capacitor is read to bit line BL0. At this time, plate line DPL changes from the L level to the H level, reading the reference voltage to bit line BL1. The reference voltage is of an intermediate value between the H and L levels of the bit lines. At this time, the potential difference between bit lines BL0, BL1 is small. Then, when sense amplifier activation signal SAP changes from the L level to the H level, sense amplifier SA is activated to amplify the potential difference between bit lines BL0, BL1. Thereafter, when Y selection signal YSW changes from the L level to the H level, the potential difference between bit lines BL0, BL1 is outputted as the potential difference between input/output lines IO0, IO1 which represents data.

Thereafter, when plate line PL1 changes to the L level, the level of bit line BL0 is stored in ferroelectric capacitor FC1, returning to the original polarized state. Then, when bit line precharging signal PBL changes to the H level, bit lines BL0, BL1 are discharged to the L level. Finally, word line WL1 changes to the L level, canceling the selection of memory cell MC21. Now, the data reading cycle is finished.

A data writing cycle will be described below. When Y selection signal YSW changes to the H level, the state of input/output line IO0 flows into bit line BL0. Then, when plate line PL1 changes to the L level, the state that has flowed into bit line BL0 is stored in ferroelectric capacitor FC1. The memory cell array will subsequently operate in the same manner as with the data reading cycle.

In the second embodiment, since voltage Vint applied to ferroelectric capacitor FC1 is equal to the minimum value of the variable range of external power supply voltage Vdd, the ferroelectric memory device can operate in the wide range of external power supply voltage Vdd and hence can be used in a wide range of applications. Because the ferroelectric film of ferroelectric capacitor FC1 is constructed such that the coercive voltage is smaller than applied voltage Vint that is the minimum value of external power supply voltage Vdd, a sufficient residual polarization required to store data with applied voltage Vint is achieved for reading and writing data stably.

The coercive voltage of the ferroelectric film may be changed by not only changing the film thickness d, but also selecting a ferroelectric material PZT or SBT, changing the stoichiometric composition ratio of the ferroelectric film, introducing an additive, and changing the electrode material.

A voltage supplying arrangement may be employed such that it supplies external power supply voltage Vdd from the external power supply to the ferroelectric memory device is supplied to peripheral circuit 104, and lowers external power supply voltage Vdd to two voltages, i.e., voltage Vboot a minimum value of a variable range of voltage Vdd and voltage Vint which is lower than voltage Vboot by a voltage for operating cell transistors TC11, TC12. Such a voltage supplying arrangement is advantageous in that it requires no boosting circuit, but requires only step-down circuits, and hence the power consumption by the ferroelectric memory device is reduced.

While preferred embodiments of the present invention have been described using specific terms, such description is for illustrative purposes only, and it is to be understood that changes and variations may be made without departing from the spirit or scope of the following claims.

What is claimed is:

1. A ferroelectric memory device comprising:

a bit line;

a ferroelectric capacitor for storing data based on residual polarization thereof, said ferroelectric capacitor comprising a ferroelectric thin film and a first capacitive electrode and a second capacitive electrode which sandwich said ferroelectric thin film therebetween;

a cell transistor connected between said first capacitive electrode and said bit line;

a first drive circuit for selectively supplying a first voltage and a ground potential to said second capacitive electrode; and a step-down circuit for reducing an external power supply voltage supplied in a predetermined voltage range into said first voltage;

said ferroelectric thin film being formed such that a coercive voltage thereof is smaller than said first voltage.

2. The ferroelectric memory device according to claim 1, wherein said ferroelectric thin film is formed such that said first voltage is equal to a minimum value of a range for allowing said ferroelectric thin film to remain sufficiently polarized.

3. The ferroelectric memory device according to claim 1, wherein said first voltage is set to a minimum value of the predetermined voltage range of said external power supply voltage.

4. The ferroelectric memory device according to claim 1, further comprising:

a second drive circuit for selectively supplying a second voltage and the ground potential to a gate of said cell transistor; and a boosting circuit for increasing said first voltage into said second voltage.

5. The ferroelectric memory device according to claim 1, wherein said first voltage comprises a constant voltage.

6. The ferroelectric memory device according to claim 3, further comprising:

a second drive circuit for selectively supplying a second voltage and the ground potential to the gate of said cell transistor; and a boosting circuit for increasing said first voltage into said second voltage.

7. A ferroelectric memory device comprising:

a ferroelectric capacitor comprising a ferroelectric thin film and a first capacitive electrode and a second capacitive electrode which sandwich said ferroelectric thin film therebetween; and means for applying a predetermined voltage to said ferroelectric capacitor to cause said ferroelectric capacitor to remain polarized for thereby storing data;

said ferroelectric thin film being formed such that a coercive voltage thereof is smaller than a reduced voltage applied between said first capacitive electrode and said second capacitive electrode and generated by reducing an external power supply voltage supplied in a predetermined voltage range.

8. The ferroelectric memory device according to claim 7, wherein said ferroelectric thin film is formed such that said reduced voltage is equal to a minimum value of a range for allowing said ferroelectric thin film to remain sufficiently polarized.

9. The ferroelectric memory device according to claim 7, wherein said reduced voltage is set to a minimum value of the predetermined voltage range of said external power supply voltage.

10. A method of manufacturing a ferroelectric memory device for storing data based on residual polarization produced when a predetermined voltage is applied to a ferroelectric capacitor comprising a ferroelectric thin film and a first capacitive electrode and a second capacitive electrode which sandwich said ferroelectric thin film therebetween, comprising the step of:

forming said ferroelectric thin film such that a coercive voltage thereof is smaller than a reduced voltage applied between said first capacitive electrode and said second capacitive electrode and generated by reducing an external power supply voltage supplied in a predetermined voltage range.

11. A method according to claim 10, wherein said ferroelectric thin film is formed such that said reduced voltage is equal to a minimum value of a range for allowing said ferroelectric thin film to remain sufficiently polarized.

* * * * *